(12) United States Patent
Liu et al.

(10) Patent No.: US 10,770,635 B2
(45) Date of Patent: Sep. 8, 2020

(54) LIGHT-EMITTING DEVICE AND MANUFACTURING METHOD THEREOF

(71) Applicant: EPISTAR CORPORATION, Hsinchu (TW)

(72) Inventors: Chien-Liang Liu, Hsinchu (TW); Ming-Chi Hsu, Hsinchu (TW); Jen-Chieh Yu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 16/419,570

(22) Filed: May 22, 2019

(65) Prior Publication Data

US 2019/0273193 A1  Sep. 5, 2019

Related U.S. Application Data

(62) Division of application No. 14/757,365, filed on Dec. 22, 2015, now abandoned.

(60) Provisional application No. 62/096,822, filed on Dec. 24, 2014.

(30) Foreign Application Priority Data

Aug. 27, 2015  (TW) .............................. 104128058 A

(51) Int. Cl.
*H01L 33/48* (2010.01)
*H01L 33/50* (2010.01)
*H01L 33/60* (2010.01)

(52) U.S. Cl.
CPC ............ *H01L 33/60* (2013.01); *H01L 33/505* (2013.01); *H01L 33/486* (2013.01)

(58) Field of Classification Search
CPC ....... H01L 33/60; H01L 33/505; H01L 33/52; H01L 33/54; H01L 33/46
See application file for complete search history.

(56) References Cited

U.S. PATENT DOCUMENTS

| | | | |
|---|---|---|---|
| 6,060,440 | A | 5/2000 | Sackariasen et al. |
| 6,649,440 | B1 | 11/2003 | Krames et al. |
| 8,283,843 | B2 | 10/2012 | Pan et al. |
| 8,896,199 | B2 | 11/2014 | Ito et al. |
| 9,000,461 | B2 | 4/2015 | Han et al. |
| 9,691,949 | B2 * | 6/2017 | Reiherzer ............... H01L 33/56 |

(Continued)

FOREIGN PATENT DOCUMENTS

| | | |
|---|---|---|
| CN | 101978516 A | 2/2011 |
| CN | 203774363 U | 8/2014 |
| CN | 104157636 A | 11/2014 |

*Primary Examiner* — Marcos D. Pizarro
*Assistant Examiner* — Antonio B Crite
(74) *Attorney, Agent, or Firm* — Muncy, Geissler, Olds & Lowe, P.C.

(57) ABSTRACT

This disclosure discloses a light-emitting device. The light-emitting device includes a light-emitting stack with a first (top) surface, a bottom surface and at least one side surface connected to the first surface and the bottom surface, a light-reflective enclosure with a second (top) surface, a contact electrode formed on the bottom surface of the light-emitting layer, and a wavelength converting layer. Moreover, the light-reflective enclosure surrounds the side surface of the light-emitting stack and exposes to the first surface. The wavelength converting layer covers the first surface and the second surface. In addition, the second surface has a plurality of fine concave structures distributed on the second surface.

6 Claims, 11 Drawing Sheets

(56) References Cited

U.S. PATENT DOCUMENTS

| | | |
|---|---|---|
| 2002/0185965 A1 | 12/2002 | Collins, III et al. |
| 2003/0048553 A1 | 3/2003 | Miwa et al. |
| 2008/0176066 A1 | 7/2008 | Chang et al. |
| 2010/0117070 A1 | 5/2010 | Adekore et al. |
| 2011/0049545 A1 | 3/2011 | Basin et al. |
| 2011/0291145 A1 | 12/2011 | Han et al. |
| 2012/0162984 A1 | 6/2012 | Fujimori et al. |
| 2012/0261699 A1* | 10/2012 | Ooyabu ............... H01L 33/505 257/98 |
| 2014/0001504 A1* | 1/2014 | Lin ....................... H01L 33/60 257/98 |
| 2014/0077195 A1 | 3/2014 | Su et al. |
| 2014/0175481 A1 | 6/2014 | Tischler |
| 2015/0001563 A1 | 1/2015 | Miki |
| 2015/0107667 A1 | 4/2015 | Tischler |
| 2015/0325760 A1 | 11/2015 | Suenaga et al. |
| 2015/0340574 A1 | 11/2015 | Tamaki |

* cited by examiner

LIGHT-EMITTING DEVICE AND MANUFACTURING METHOD THEREOF

CROSS-REFERENCE TO RELATED APPLICATION

This application is a Divisional of co-pending application Ser. No. 14/757,365, filed on Dec. 25, 2015, for which priority is claimed under 35 U.S.C. § 120; which claims priority of Application No. 104128058 filed in Taiwan on Aug. 27, 2015; and this application claims priority of U.S. Provisional Application No. 62/096,822 filed on Dec. 24, 2014, the entire contents of all of which are hereby incorporated by reference.

BACKGROUND

Technical Field

The present disclosure relates to a light-emitting device and manufacturing method, and in particular to a light-emitting device with a structure of a light-reflective enclosure.

Description of Background Art

A light-emitting diode (LED) has the characteristics of low power consumption, low heat generation, long operational life, shockproof, small volume, quick response and good opto-electrical property so the LED has been widely used in a variety of fields demanded with light-emitting elements, such as automobiles, household appliances, and lighting products, etc.

There are several ways to convert the pure light emitted from LED to another color. For example, a phosphor layer covering on the LED can convert the whole or a part of light from the LED to another color. The phosphor is a substance of photoluminescence, also known as a wavelength converting material, and it can absorb a first light emitted from the LED and emit a second light different from the first light afterward. If the first light is not absorbed completely, the remained portion of the first light can mix with the second light so as to form a mixed light of the other color. However, ratios of light intensity of the first light and the second light (a ratio of mixed light) under different view angles are different, and as a result, the color temperatures of the mixed light under different view angles are also different.

SUMMARY OF THE DISCLOSURE

The present disclosure provides a light-emitting device including a light-emitting stack with a first (top) surface, a bottom surface and at least one side surface connected to the first surface and the bottom surface, a light-reflective enclosure with a second (top) surface, a contact electrode formed on the bottom surface of the light-emitting stack, and a wavelength converting layer. Moreover, the light-reflective enclosure surrounds the side surface of the light-emitting stack and exposes to the first surface. The wavelength converting layer covers the first surface and the second surface. In addition, the second surface has a plurality of fine concave structures distributed on the second surface.

The present disclosure provides a manufacturing method of a light-emitting device including: providing a light-emitting stack with a first (top) surface, a bottom surface and at least one side surface connected to the first surface and the bottom surface; forming a contact electrode on the bottom surface of the light-emitting stack; connecting the light-emitting stack to a temporary substrate where exposes the side surface and one of the first surface and the bottom surface; covering a light-reflective material on the exposed side surface and one of the first surface and the bottom surface; removing a portion of light-reflective material so as to expose the first surface or the bottom surface to form a light-reflective enclosure including a second surface having a plurality of fine concave structures; and removing the temporary substrate.

The present disclosure provides a light-emitting device including: a light-emitting stack with a first (top) surface, a bottom surface and at least one side surface connected to the first surface and the bottom surface; a light-reflective enclosure, having a second (top) surface, an inner sidewall, and an outer sidewall, surrounding the side surface of the light-emitting stack, exposing the first surface, wherein the second surface protrudes outward from the inner sidewall to the outer sidewall; and a wavelength converting layer covering the first surface and the second surface.

BRIEF DESCRIPTION OF THE DRAWINGS

The accompanying drawings are included to provide easy understanding of the application, and are incorporated herein and constitute a part of this specification. The drawings illustrate the embodiments of the application and, together with the description, serve to illustrate the principles of the application.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure. In addition, these drawings are not necessarily drawn to scale. Likewise, the relative sizes of elements illustrated by the drawings may differ from the relative sizes depicted.

The following shows the description of embodiments of the present disclosure in accordance with the drawings.

Figure 1A:
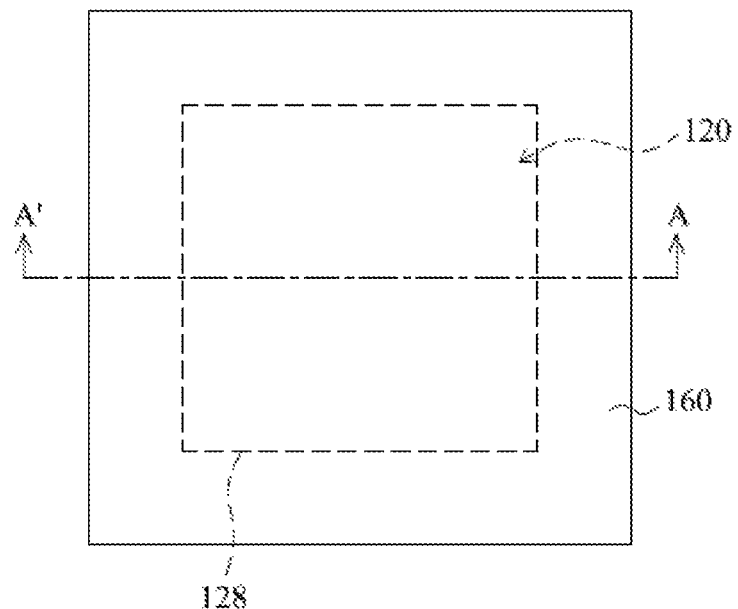
FIGS. 1A, 1B, and 1C illustrate a schematic diagram of a light-emitting device in accordance with one embodiment of the present disclosure.
Figure 1B:
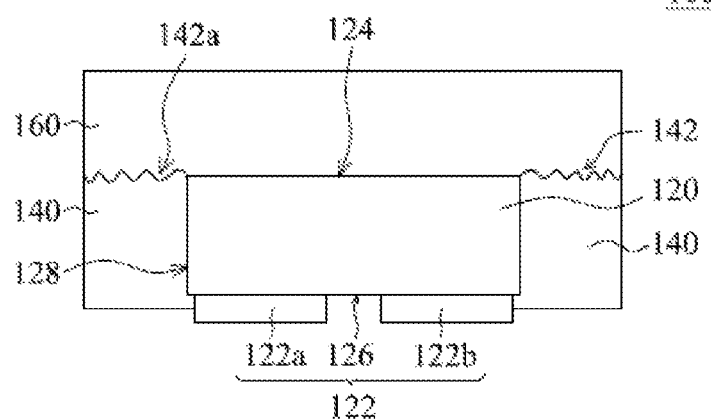

FIG. 1A illustrates a top view of a light-emitting device 100 in accordance with one embodiment of the present disclosure. FIG. 1B illustrates a cross-sectional view of a light-emitting device 100 from cross-sectional line A-A' in FIG. 1A. Referring to FIGS. 1A and 1B, the light-emitting device 100 includes a light-emitting stack 120 with a top surface 124, a bottom surface 126 and a plurality of side surfaces 128, wherein the side surfaces 128 connect to the top surface 124 and the bottom surface 126. In one embodiment, the light-emitting stack 120 is hexahedral structure so as to have four side surfaces 128. However, the light-emitting stack 120 of triangular column, hexagonal column or other shapes is not limited by the number of side surfaces. A light-reflective enclosure 140 surrounds the side surfaces 128 of the light-emitting stack 120, and exposes the top surface 124. Referring to FIG. 1B, the light-reflective enclosure 140 has an upper surface 142 at a similar horizontal position with the top surface 124 of the light-emitting stack 120 and faces to the same direction therewith. The upper surface 142 has a plurality of fine concave structures 142a distributed thereon. A wavelength converting layer 160 covers both the top surface 124 and the upper surface 142. In one embodiment, the wavelength converting layer 160 can fill the plurality of fine concave structures 142a. Moreover, at least two contact electrodes 122 are formed on the bottom surface 126 of the light-emitting stack 120. For example, a positive contact electrode 122a and a negative contact electrode 122b separately formed on the bottom surface 126 of the light-emitting stack 120. However, the amount of the contact electrodes is not limited to it. For example, the amount of both the positive contact electrode and the negative contact electrode are greater than or equal to two. In another example, the amount of the positive contact electrode can be different from the negative contact electrode, such as the amount of one contact electrode greater than or equal to N, the other contact electrode less than N, wherein N is a positive integer greater than 2.

Figure 1C:
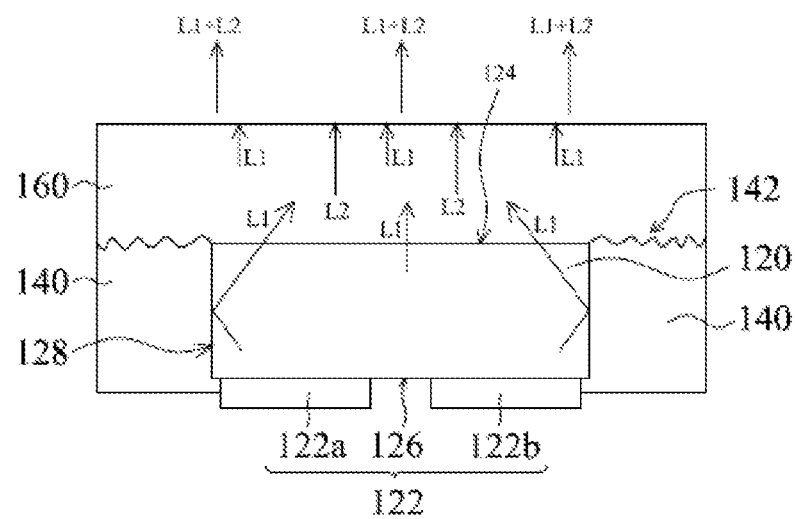

FIG. 1C illustrates a schematic diagram of light locus of a light-emitting device 100 in accordance with one embodiment of the present disclosure. First light L1 can be emitted from the light-emitting stack 120, and a part of the first light L1 can be converted to second light L2 during passing through the wavelength converting layer 160. The first light L1 and the second light L2 can be mixed within the wavelength converting layer 160 and then emitted out. A part of the first light L1 which has small angle can pass through the top surface 124 directly, and another part of the first light L1 which has wide angle can be reflected or scattered by the light-reflective enclosure 140 and be directed to a central area of the wavelength converting layer 160. The emitted first light L1 can be reflected by the light-reflective enclosure 140 and then escape away from the top surface 124 of the light-emitting stack 120. Therefore, by concentrating the first light L1 above the top surface 124 and reducing light escaped from the side surface 128, the non-uniformity of color distribution caused by a difference of a ratio of the mixed light above the top surface 124 and periphery of the side surface 128 can be eliminated so that the uniformity of color distribution under different view angles can be increased and the intensity of the small angle can be enhanced at the same time. The uniformity of color distribution under different view angles can be expressed in the term of Δu'v' under different view angles, wherein Δu'v' is a deviation between the chromaticity values of u'v' and base values (u0', v0'), and the base value means the average of chromaticity values from all angles. The greater value of Δu'v' means the chromaticity value is farther away the averaged chromaticity value, and also represents worse uniformity of color distribution. If the wavelength converting layer 160 has a more uniform thickness, for example, a variation of a thickness and average thickness is less than 5%, the first light L1 from every direction can travel along a distance within the wavelength converting layer 160 more uniformly so the color of the mixed light is more identical. Furthermore, the upper surface 142 of the light-reflective enclosure 140 has a plurality of fine concave structures 142a so that the light-reflective enclosure 140 and the wavelength converting layer 160 have larger bonding strength than that with a flat surface. Moreover, the fine concave structures 142a can scatter light to increase the light extraction so as to increase uniformity of light and intensity thereof.

The light-emitting stack 120 can be a light-emitting diode structure that converts electrical power to light energy so as to emit the first light L1. In one embodiment, the light-emitting stack 120 is flip chip type light-emitting diode structure, and includes a growth substrate (not shown), a first semiconductor layer (not shown), an active layer (not shown), and a second semiconductor layer (not shown), wherein the growth substrate can be sapphire, the first semiconductor layer can be n-type semiconductor layer, and the second semiconductor layer can be p-type semiconductor layer. The contact electrodes 122a/122b are respectively electrically connected to the first semiconductor layer and the second semiconductor layer, and electrically connect the light-emitting device 100 to external power source.

The light-reflective enclosure 140 can reflect the first light L1 emitted from the light-emitting stack 120 so of the emitted light of the light-emitting stack 120 is directed to and concentrated on the top surface 124. The light-reflective enclosure 140 can cover a part or the whole side surface 128 of the light-emitting stack 120. In one embodiment, because the light-reflective enclosure 140 covers partial or the whole side surface 128 of the light-emitting stack 120, the leakage of the first light L1 emitted from the light-emitting stack 120 from the side surface 128 is decreased. Moreover, the light-reflective enclosure 140 also covers a part of or the whole sidewall of the contact electrode 122, or is higher than the top surface 124 of the light-emitting stack 120 so as to decrease a leakage of light from the side surface 128.

A bottom position of the contact electrode 122a and/or 122b to the upper surface 142 has an average height, and the bottom position thereof to the top surface 124 also has an average height. The difference of above-mentioned two heights can be adjusted depending on optical properties. The average height is defined as the average of the height from the bottom position of the contact electrode 122a and/or 122b to the top surface 124 of the light-emitting stack 120 or the upper surface 142 of the light-reflective enclosure 140 which is measured by five positions separated with nearly the same distance from left to right. In one embodiment, a variation of two average heights is less than 40 μm. If the variation of two average heights is greater than 40 μm, a gap may be formed during the formation of the wavelength converting layer 160, the optical properties may be affected, for example, the total reflection may occur. Besides, it may induce the crack easily because the curvature of the interface between two average heights is too large.

The light-reflective enclosure 140 has a plurality of fine concave structures 142a distributed on the upper surface 142, and the fine concave structures 142a can be regularly or irregularly distributed. In one embodiment, a surface roughness of the upper surface 142 of the light-reflective enclosure 140 is greater than the top surface 124 of the light-emitting stack 120. In one embodiment, the surface roughness of the upper surface 142 has a value of Root-Mean-Square (RMS, Rq) greater than 100 nm at an area of 5 μm×5 μm. In another embodiment, RMS is ranged from 100 nm to 400 nm.

The light-reflective enclosure 140 can be composed of light-reflective material. In one embodiment, the light-reflective material can be titanium oxide (TiO$_2$), zirconia (ZrO$_2$), niobium oxide (Nb$_2$O$_5$), alumina (Al$_2$O$_3$), silica (SiO$_2$), magnesium fluoride (MgF$_2$), aluminum nitride (Al$_2$N$_3$) in bulk. In another embodiment, the light-reflective material is a light-reflective paste formed of above mentioned material mixed with a binding agent. The binding agent can be silicone resin, acrylic resin, or epoxy resin.

The wavelength converting layer 160 can include a transparent binder and a plurality of wavelength converting particles dispersed within the transparent binder, wherein the wavelength converting particles can absorb the first light to convert to the second light. In one embodiment, the first light to excite the wavelength converting particles is blue light emitted from the light-emitting diode, and a dominant wavelength is in the range of 430 nm to 490 nm. The wavelength converting particles absorb the first light to excite the second light which can be yellow light, and a dominant wavelength of the yellow light is in the range of 530 nm to 590 nm. The wavelength converting layer 160 can include wavelength converting particles of single material or multiple materials. In another embodiment, the wavelength converting layer 160 includes wavelength converting particles capable of emitting yellowish green light and red light.

Material of the wavelength converting particles can include inorganic phosphor, organic fluorescent colorants, semiconductors, or combinations thereof. In one embodiment, the material of the wavelength converting particles is phosphor, and the phosphor can be selected from the group consisting of Y$_3$Al$_5$O$_{12}$, Gd$_3$Ga$_5$O$_{12}$:Ce, (Lu 、 Y)$_3$Al$_5$O$_{12}$: Ce, SrS:Eu, SrGa$_2$S$_4$:Eu, (Sr 、 Ca 、 Ba)(Al 、 Ga)$_2$S$_4$:Eu, (Ca 、 Sr)S:(Eu 、 Mn), (Ca 、 Sr)S:Ce, (Sr 、 Ba 、 Ca)$_2$Si$_5$N$_8$:Eu, (Sr 、 Ba 、 Ca)(Al 、 Ga)Si N$_3$:Eu, (Ba 、 Sr 、 Ca)$_2$SiO$_4$:Eu, (Ca 、 Sr 、 Ba)Si$_2$O$_2$N$_2$:Eu, K$_2$(Si 、 Ti 、 Zr 、 Sn)F$_6$:Mn and Na$_2$(Ti 、 Zr)F$_6$:Mn. The semiconductor material can include II-VI semiconductor compound, III-V semiconductor compound, IV-VI semiconductor compound, or combinations thereof. The semiconductor material further includes quantum dot material. The quantum dot material can be selected from the group consisting of ZnS, ZnSe, ZnTe, ZnO, CdS, CdSe, CdTe, GaN, GaP, GaSe, GaSb, GaAs, AlN, AlP, AlAs, InP, InAs, Te, PbS, InSb, PbTe, Pb Se, SbTe, ZnCdSeS, and CuInS.

Figure 2:
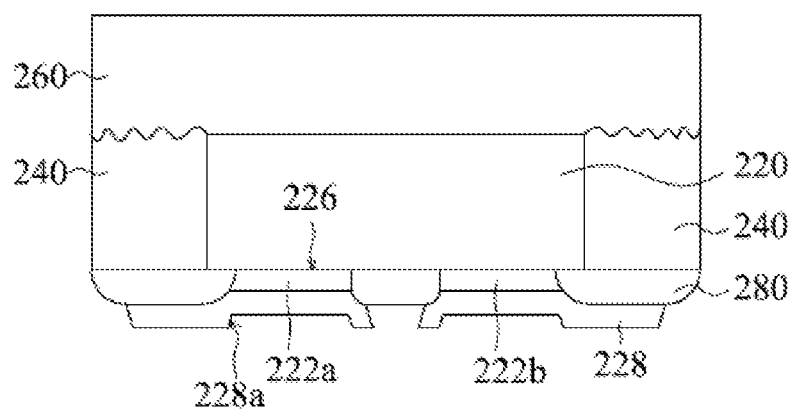
FIG. 2 illustrates a cross-sectional view of a light-emitting device in accordance with another embodiment of the present disclosure.

FIG. 2 illustrates a cross-sectional view of the light-emitting device 200 in accordance with another embodiment of the present disclosure. The light-emitting device 200 includes a light-emitting stack 220, a light-reflective enclosure 240 surrounding the light-emitting stack 220, a wavelength converting layer 260 covers both the light-emitting stack 220 and the light-reflective enclosure 240. A bottom surface 226 of the light-emitting device 200 is formed on contact electrodes 222a and 222b and a reflective layer 280, and the reflective layer 280 surrounds the contact electrodes 220a and/or 220b from the bottom view. Moreover, each of the contact electrodes 220a and 220b has an extension pad formed thereon, and the extension pads 228 and the contact electrodes 220a and/or 220b are connected to each other respectively. A ratio of area of the extension pad 228 and the contact electrode 220a or 220b can be adjusted depending on the design of light-emitting device 200. In one embodiment, a surface area of the extension pad 228 is greater than a surface area of the contact electrode 222a or 222b so the extension pad 228 completely covers the contact electrodes 220a and/or 220b. In one embodiment, a thickness of the reflective layer 280 is greater than a thickness of the contact electrodes 220a and/or 220b so the extension pad 228 extending from the contact electrodes 220a and/or 220b to the reflective layer 280 forms an inclined plane 228a due to a gap of height. In another embodiment, the contact electrodes 220a and/or 220b and the reflective layer 280 is coplanar so there is no inclined plane 228a in-between. The reflective layer 280 can include light-reflective material. Moreover, the light-reflective material of the reflective layer 280 can be the same as or different from that of the light-reflective enclosure 240. The reflective layer 280 can be formed by screen printing. The extension pad 228 is made of material with high conductivity, such as copper (Cu), silver (Ag), or gold (Au). In one embodiment, the extension pad 228 can be formed by plating copper.

FIGS. 3A to 3G illustrate a method of making the light-emitting device in accordance with one embodiment of the present disclosure. First, a plurality of the light-emitting stacks 120a, 120b, 120c are provided. The specific structure of the light-emitting stacks 120a, 120b, 120c can be referred to above description. In one embodiment, the light-emitting stacks 120a, 120b, 120c have the same or similar wavelength of light, such as ultraviolet light, blue light, red light, infrared light, and so on. Furthermore, at least one contact electrode can be preformed on the bottom surface of each the light-emitting stacks 120a, 120b, 120c. For example, in a flip chip LED die, at least two contact electrodes can be preformed on the bottom surface of each the light-emitting stacks 120a, 120b, 120c.

Figure 3A:
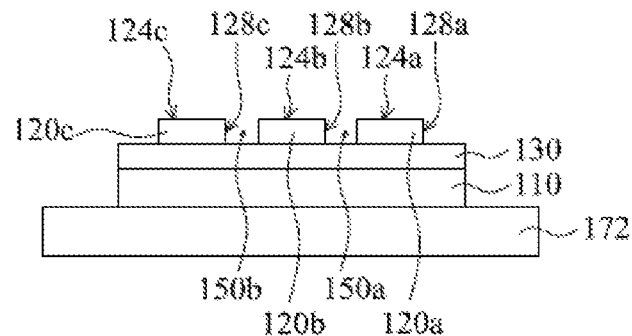
FIGS. 3A to 3G illustrate a method of making the light-emitting device of FIGS. 1A to 1C.
Figure 3B:
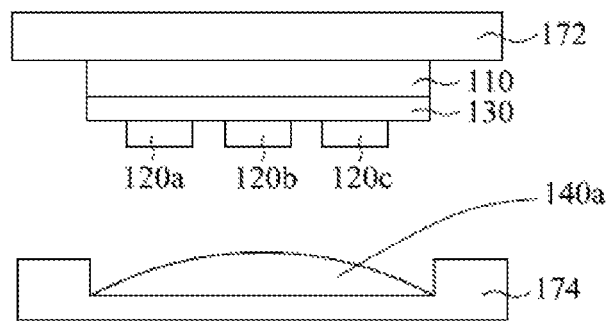
Figure 3C:
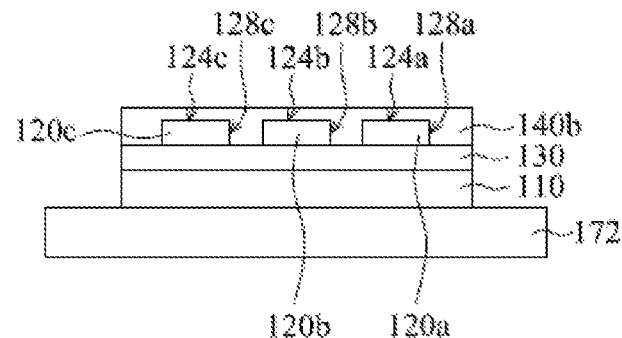

Referring to FIG. 3A, the light-emitting stacks 120a, 120b, 120c are fixed on a temporary substrate 110 through an adhesive layer 130. Two adjacent light-emitting stacks have a gap, for example, the light-emitting stacks between 120a and 120b and between 120b and 120c respectively have a gap 150a and 150b. One of the side surfaces, the top surfaces, and the bottom surfaces of the light-emitting stacks 120a, 120b, and 120c can be exposed. In one embodiment, the top surface 124a, 124b, or 124c and the side surface 128a, 128b, or 128c of each of the light-emitting stacks 120a, 120b, and 120c are exposed. Next, the light-reflective material 140b covers the exposed surfaces of the light-emitting stacks, as shown in FIG. 3C. The formation of the light-reflective material 140b can be molding, such as transfer molding or compression molding. If the compression molding method is adopted, the temporary substrate 110 can be attached to the first mold 172. Referring to FIG. 3B, an uncured light-reflective material 140a, such as light-reflective paste, fills in the second mold 174 which has a recess that can receive the light-reflective paste. Next, the first mold 172 and the second mold 174 compress each other so the plurality of the light-emitting stacks 120a, 120b, 120c are embedded in the light-reflective paste. A shape of the light-reflective material can be confined by the first mold 172 and the second mold 174. In the current step and following steps, the light-reflective material 140a can be cured and shaped by heat. The heating temperature can be adjusted depending on the property of the light-reflective material 140a. Moreover, adjusting the amount of the paste or the pressure within the mold can control the thickness of the light-reflective material 140b in demand. Referring to FIG. 3C, after curing the paste, the second mold 174 can be released so the cured light-reflective material 140b covers the top surfaces 124a, 124b, 124c and the side surfaces 128a, 128b, 128c of the plurality of light-emitting stacks 120a, 120b, 120c. In one embodiment, the top surfaces 124a, 124b, 124c are surfaces of growth substrates (not shown) of the light-emitting diode structures (light-emitting stacks) so that the light-reflective material 140b covers the surfaces of the growth substrates of the light-emitting diode structures. In another embodiment, the light-reflective material 140b covers the bottom surfaces (not shown) and the side surfaces 128a, 128b, 128c of the plurality of light-emitting stacks 120a, 120b, 120c, and the bottom surfaces are surfaces of the contact electrodes, and the light-reflective material 140b covers the surfaces of the contact electrodes of the light-emitting diode structures now.

Figure 3D:
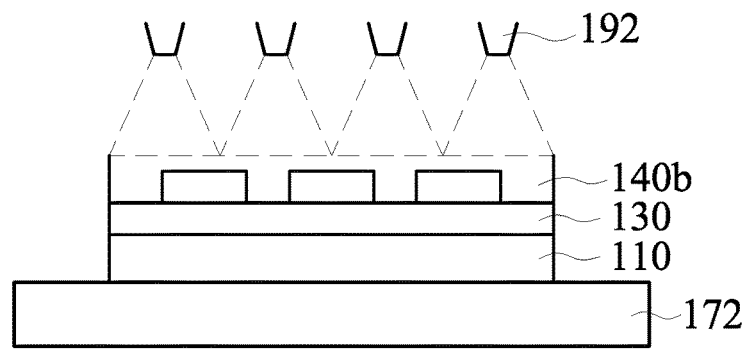
Figure 3E:
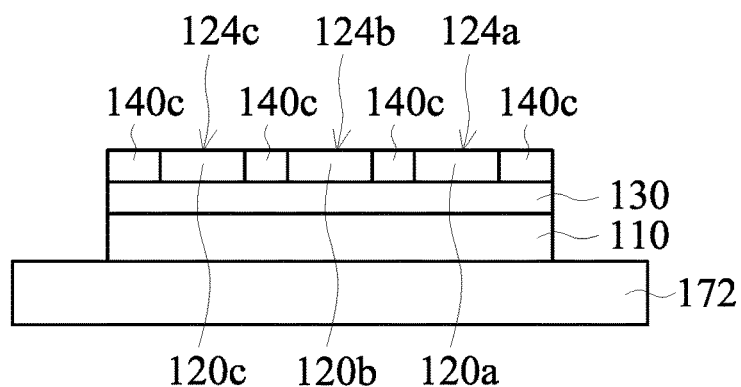

Referring to FIGS. 3D and 3E, a part of the light-reflective material 140b is removed to expose the top surfaces 124a, 124b, 124c of the light-emitting stacks 120a, 120b, 120c and to form the light-reflective enclosure 140c. The method of the removal of the light-reflective material 140b includes wet deflash, such as water jet deflash or wet blasting deflash. The concept of the water jet deflash is to use a nozzle 192 to jet out liquid, such as water, to remove the light-reflective material 140b by jetting pressure. A method of the wet blasting deflash is to use liquid containing specific particles to remove the light-reflective material 140b by impacting the surface of the light-reflective material 140b with liquid pressure and the particles. In one embodiment, the top surfaces are the surfaces of the growth substrates so that the surfaces of the growth substrates are exposed after removing a part of the light-reflective material 140b. In another embodiment, after removing a portion of the light-reflective material 140b, the bottom surfaces (not shown) of the light-emitting stacks 120a, 120b, 120c are exposed, wherein the bottom surfaces are the surfaces of the contact electrodes. Therefore, the rate of removing the light-reflective material 140b can be controlled by the intensity of the impact force between substances. Furthermore, a plurality of the fine concave structures on the top surfaces of a light-reflective enclosure 140c can be formed by the impact force between substances.

Figure 3F:
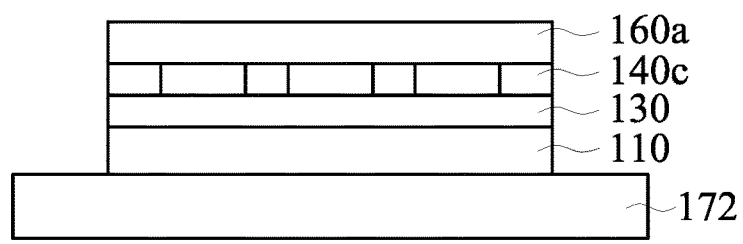

Referring to FIG. 3F, after exposing the top surfaces of the light-emitting stacks and forming the light-reflective enclosure 140c, a wavelength converting layer 160a can cover the top surfaces of the light-emitting stacks and the upper surface of the light-reflective enclosure 140c. The method of covering the wavelength converting layer 160a can include coating method, laminating of heating press method, or molding method. In one embodiment, the wavelength converting layer 160a is formed by laminating of heating press.

Figure 3G:
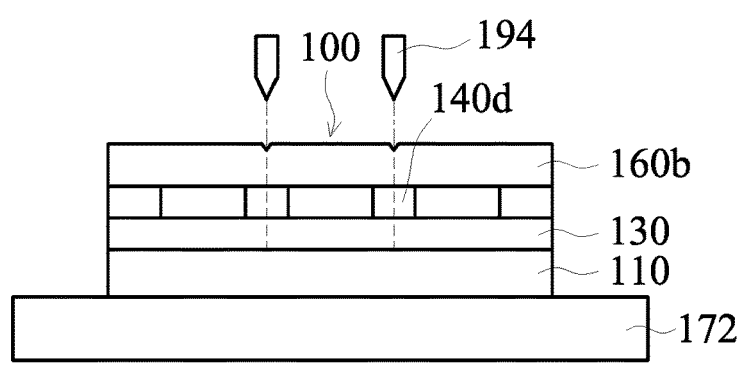

Referring to FIG. 3G, the light-reflective enclosure 140c is separated by cutting the light-reflective enclosure 140c so as to form a light-emitting device 100 with a light-reflective enclosure 140d. In one embodiment, the light-reflective enclosure 140c and the wavelength converting layer 160b can be cut together after covering the wavelength converting layer 160a. Therefore, a side wall of the light-emitting device 100 includes light-reflective enclosure 140d and the wavelength converting layer 160b. In other words, the light-reflective enclosure 140d and the wavelength converting layer 160b have a coplanar used as the side wall of the light-emitting device 100. The method of cutting can use a cutting tool by a blade 194.

Figure 4A:
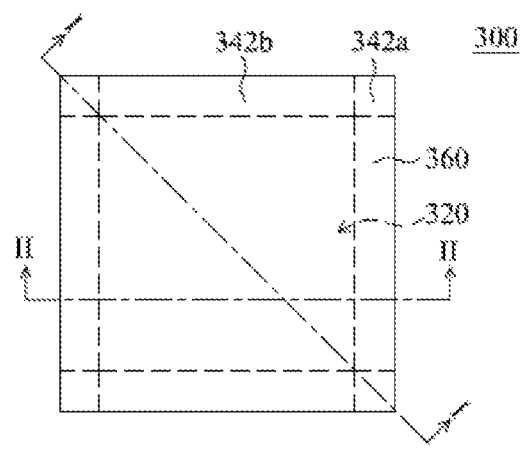
FIGS. 4A to 4C illustrate a schematic diagram of a light-emitting device in accordance with another embodiment of the present disclosure.
Figure 4B:
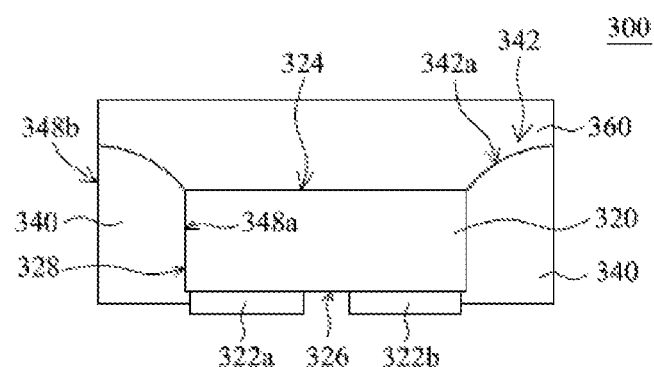
Figure 4C:
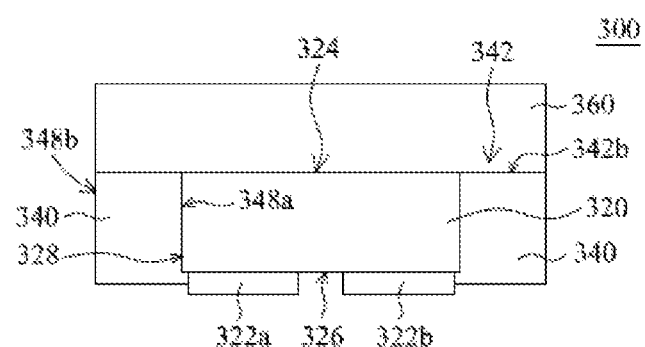

FIG. 4A illustrates a top view of a light-emitting device 300 in accordance with another embodiment of the present disclosure. FIG. 4B illustrates a cross-sectional view from the cross-sectional line I-I in FIG. 4A. FIG. 4C illustrates a cross-sectional view from the cross-sectional line II-II in FIG. 4A. Referring to FIGS. 4A and 4B, a light-emitting device 300 includes a light-emitting stack 320 with a top surface 324, a bottom surface 326, and a plurality of side surfaces 328, wherein the plurality of side surfaces 328 is connected to the top surface 324 and the bottom surface 326. A light-reflective enclosure 340 surrounds the plurality of side surfaces 328 and exposes the top surface 324. The light-reflective enclosure 440 includes an upper surface 342, an inner sidewall 348a and an outer sidewall 348b. Referring to FIG. 4B, the upper surface 342 of the light-reflective enclosure 340 is located on the same side with the top surface 324 of the light-emitting stack 320 and outside the top surface 324. A wavelength converting layer 360 covers the top surface 324 and the upper surface 342 together. Furthermore, contact electrodes 322a, 322b are formed on the bottom surface 326 of the light-emitting stack 320. Referring to FIGS. 4A, 4B, and 4C, the upper surface 342 of the light-reflective enclosure 340 has a convex structure 342a and a flat region 342b. The convex structure 342a protrudes outward from the inner sidewall 348a to the outer sidewall 348b. Moreover, the convex structure 342a is located on four corners of the light-reflective enclosure 340, and can be an arc-like structure. A height of the inner sidewall 348a is lower than the height of the outer sidewall 348b. Viewing from the top view (FIG. 4A), the convex structure 342a and the flat region 342b are located around the light-emitting stack 320 and the flat region 342b is located between two convex structures 342a.

The light-reflective enclosure 340 can increase the uniformity of color distribution under different view angles, and raise the intensity of the small angle. Furthermore, the upper surface 342 of the light-reflective enclosure 340 has the structure which protrudes outward from the inner sidewall 348 to the outer sidewall 348b so as to increase the contact area between the light-reflective enclosure 340. Moreover, the wavelength converting layer 360 can raise the bonding strength therebetween.

Figure 5A:
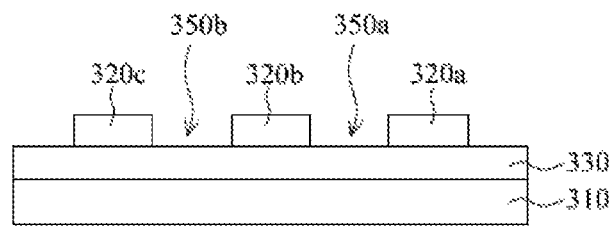
FIGS. 5A to 5F illustrate a method of making the light-emitting device disclosed in FIGS. 4A to 4C.
Figure 5B:
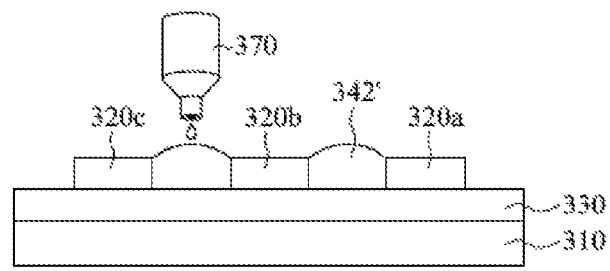
Figure 5C:
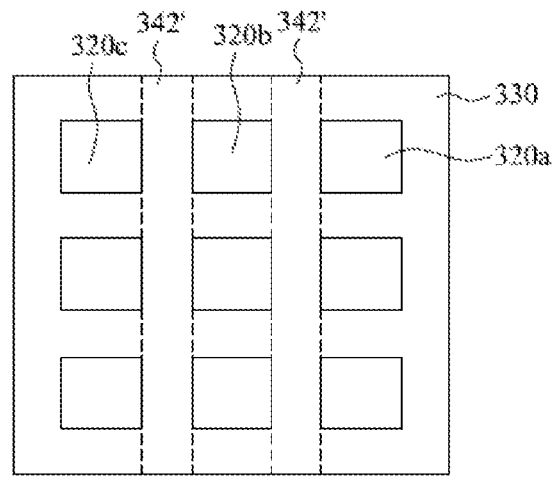
Figure 5D:
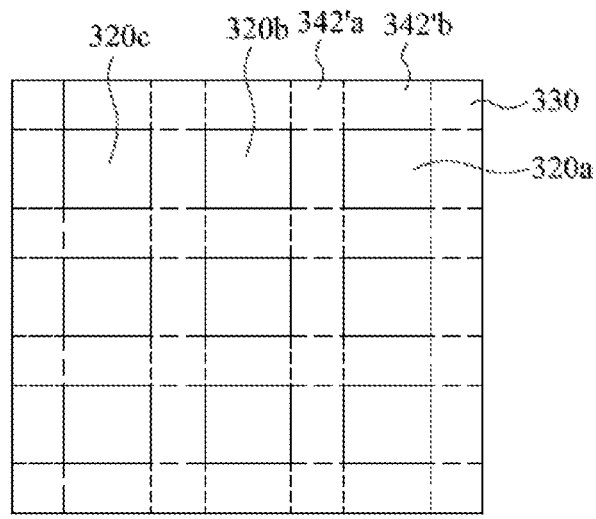

FIGS. 5A to 5F illustrate a method of making the light-emitting device 300 in accordance with another embodiment of the present disclosure. Referring to FIG. 5A, light-emitting stacks 320a, 320b, 320c are attached on a temporary substrate 310, wherein the attaching method can be through an adhesive layer 330. Between two light-emitting stacks there is a gap. For example, the light-emitting stacks between 320a and 320b and between 320b and 320c have a gap 350a and 350b, respectively. After that, referring to FIG. 5B, the gaps 350a, 350b are filled by a dispenser 370 to form a light-reflective material 342'. Referring to FIGS. 5C and 5D, the method of filling the gaps by the dispenser 370 can fill each row and each column in order. In one embodiment, each row is filled first, and then each column is filled. Because crossing positions of each row and each column are dispensed repeatedly, a convex structure 342'a is formed at each crossing position, and a flat structure 342'b is formed between the convex structures 342'a and periphery of the side surfaces of the light-emitting stacks 320a, 320b, and 320c. The method of filling the gaps is not limited to the above-mentioned method so the convex structures 342'a may be formed at all or a portion of crossing positions.

Figure 5E:
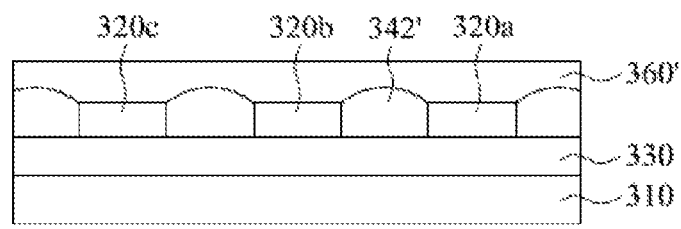
Figure 5F:
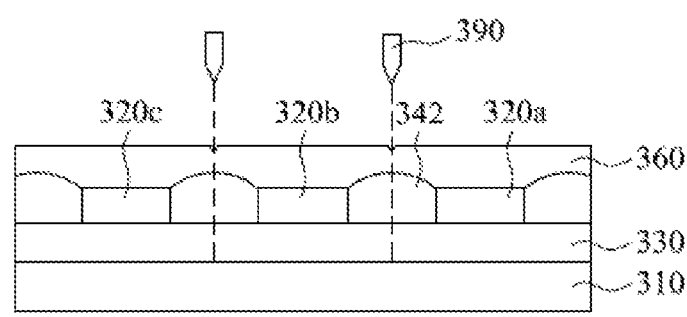

Referring to FIG. 5E, a wavelength converting layer 360' covers the top surfaces of the light-emitting stacks 320a, 320b, and 320c and the upper surface of the light-reflective material 342', and the method of covering of the wavelength converting layer 360' can refer to above mentioned embodiments. After that, referring to FIG. 5F, the light-reflective material 342' and the wavelength converting layer 360 are cut by a blade 390 so as to form a light-emitting device 300 with a light-reflective enclosure 342 and a wavelength converting layer 360, and the light-reflective enclosure 342 and the wavelength converting layer 360 are coplanar to form a sidewall of the light-emitting device 300.

Figure 6A:
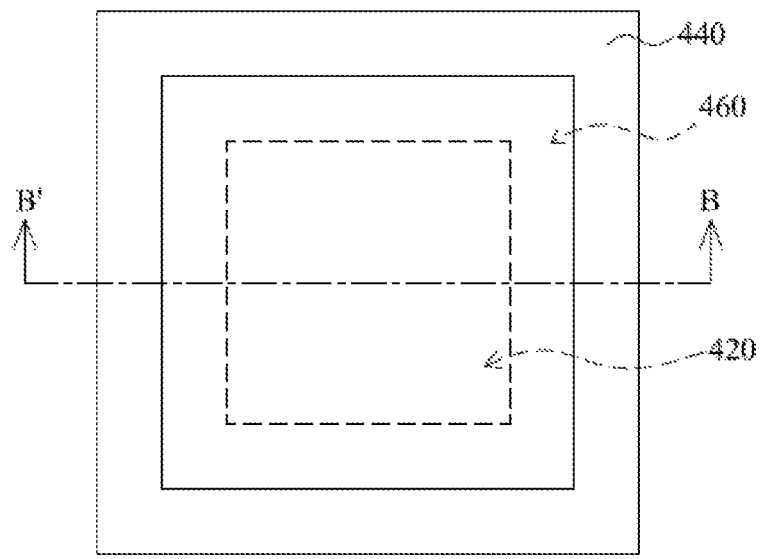
FIGS. 6A and 6B illustrate a top view and a cross-sectional view of a light-emitting device in accordance with another embodiment of the present disclosure.
Figure 6B:
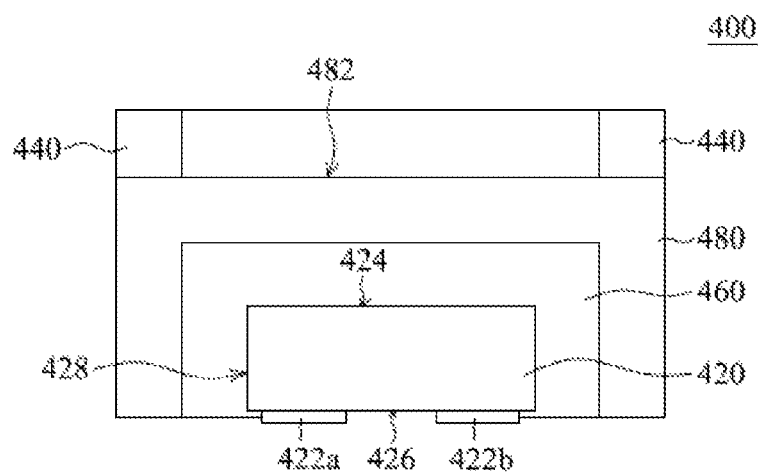

FIG. 6A illustrates a top view of a light-emitting device 400 in accordance with another embodiment of the present disclosure. FIG. 6B illustrates a cross-sectional view of a light-emitting device 400 from cross-sectional line B-B' in FIG. 6A. Referring to FIGS. 6A and 6B, a light-emitting device 400 includes a light-emitting stack 420 with a top surface 424, a bottom surface 426, and a plurality of side surfaces 428, wherein the plurality of side surfaces 428 are connected to the top surface 424 and the bottom surface 426. Contact electrodes 422a, 422b are formed on the bottom surface 426 of the light-emitting stack 420. A wavelength converting layer 460 covers the top surface 426 of the light-emitting stack 420 and the plurality of side surfaces 428, A transparent protecting layer 480 covers the wavelength converting layer 460, wherein the transparent protecting layer 480 includes a top surface 482 located on the top surface 482 of the transparent protecting layer 480 and exposing a part of the top surface 482. In one embodiment, viewing from the top view (FIG. 6A), the shape of the light-reflective enclosure 440 is hollow rectangle surrounding the light-emitting stack 420, and exposes a portion of the top surface 482 of the transparent protecting layer 480.

The light-reflective enclosure 440 of a light-emitting device 400 of the embodiment in FIGS. 6A and 6B can increase the uniformity of color distribution under different view angles and raise the intensity of the small angle. Furthermore, the transparent protecting layer 480 used to cover the wavelength converting layer 460 can avoid that material within the wavelength converting layer 460 from contacting water or oxygen outside so as to enhance the reliability of the wavelength converting layer 460.

The material of the transparent protecting layer 480 can use any material with properties of light transmitting and resisting external water and oxygen, such as silicone resin, epoxy resin, or glass.

Figure 7A:
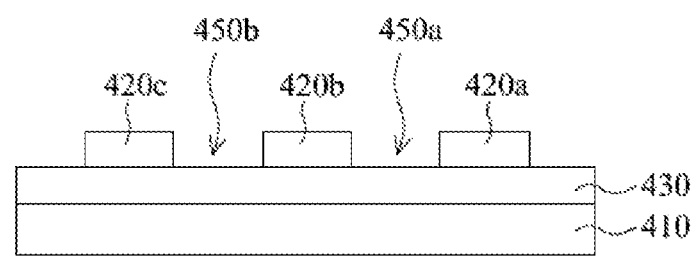
FIGS. 7A to 7F illustrate a method of making the light-emitting device disclosed in FIGS. 6A and 6B.
Figure 7B:
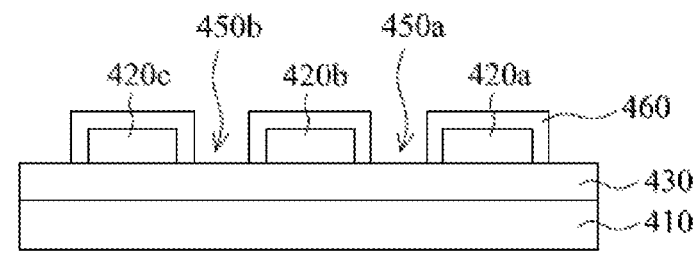

FIGS. 7A to 7F illustrate a method of making the light-emitting device 400 in accordance with another embodiment of the present disclosure. Referring to FIG. 7A, light-emitting stacks 420a, 420b, 420c are attached on a temporary substrate 410. There may be a gap between two light-emitting stacks. For example, there is a gap 450a and 450b respectively between the light-emitting stacks 420a and 420b and between the light-emitting stacks 420b and 420c. Moreover, the attaching method can use an adhesive layer 430. After that, referring to FIG. 7B, the wavelength converting layer 460 covers the top surfaces and the plurality of side surfaces the light-emitting stacks 420a, 420b, 420c. In one embodiment, a wavelength converting film can be laminated on the light-emitting stacks 420a, 420b, and 420c. At this time, the gaps 450a and 450b are not filled with the wavelength converting film. In another embodiment, the wavelength converting film fills the gaps 450a and 450b. Next, the wavelength converting film can be separated by removing a part of the wavelength converting film which is filled in the gaps 450a and 450b.

Figure 7C:
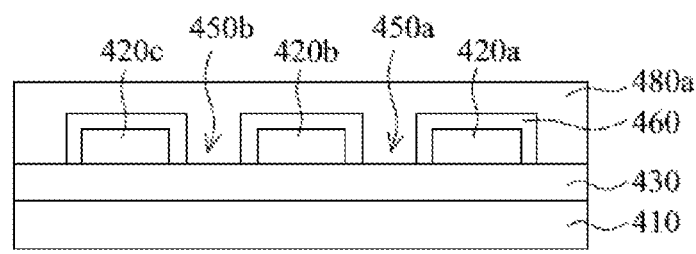
Figure 7D:
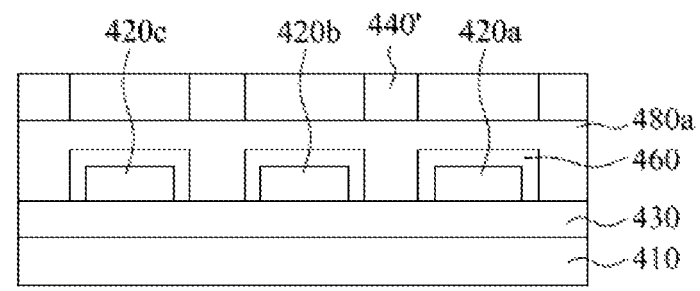
Figure 7E:
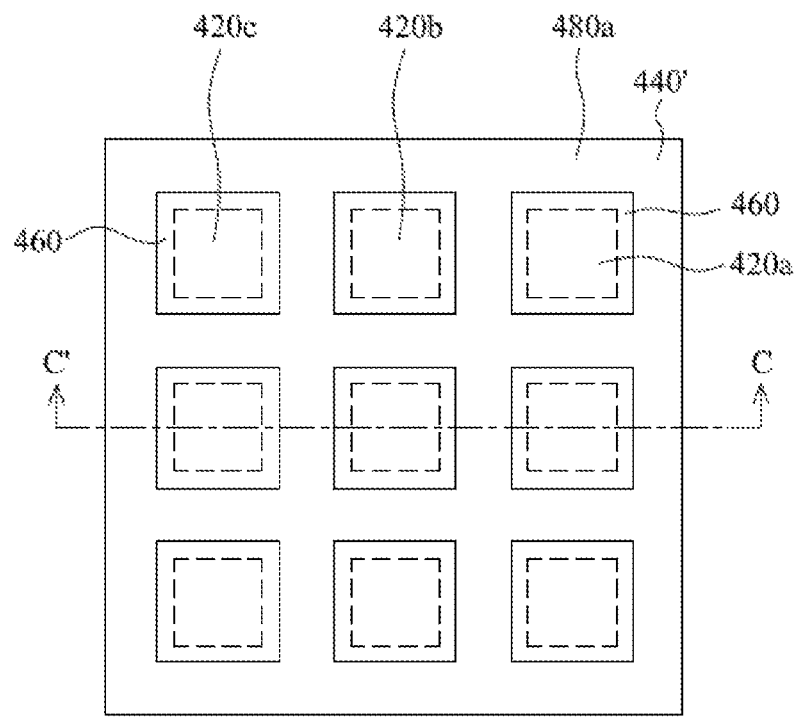
Figure 7F:
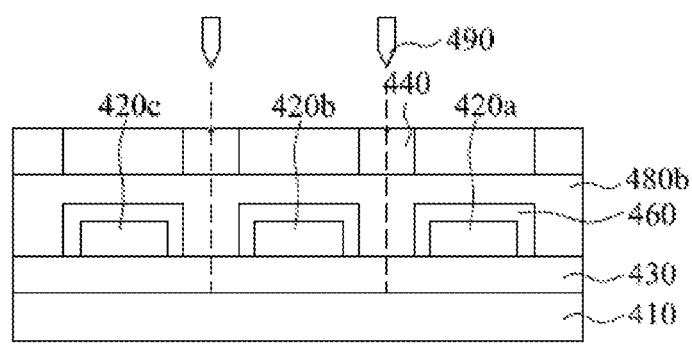

After that, referring to FIG. 7C, a transparent protecting layer 480a covers the wavelength converting layer 460. In one embodiment, the transparent protecting layer 480a fills the gaps 450a, 450b completely and forms a flat surface. In one embodiment, a closed enclosure (not shown) is formed on a periphery of the temporary substrate 410 and the adhesive layer 430, and then uncured material of the transparent protecting layer 480a fills in the closed enclosure and covers the wavelength converting layer 460. After that, the material of the transparent protecting layer 480a is cured. In one embodiment, a surface of the transparent protecting layer 480a can be smoother by polishing after curing. The method of covering of the transparent protecting layer 480a can be coating, laminating, or molding. After that, referring to FIGS. 7D and 7E, a light-reflective material can be formed on the transparent protecting layer 480a. In one embodiment, the light-reflective material 440' aligns with the light-emitting stacks 420a, 420b, and 420c covered with the wavelength converting layer 460 and has a structure with a plurality of grids formed on the transparent protecting layer 480a. The light-reflective material 440' exposes a part of the transparent protecting layer 480a and each of the grids corresponds to each of the light-emitting stacks. The method of forming the light-reflective material 440' can be screen printing. Because the transparent protecting layer 480a has formed a flat plane so the light-reflective material 440' can be handled easily by screen printing. After that, referring to FIG. 7F, the light-reflective material 440' and the transparent protecting layer 480a are cut by a blade 490 so as to form the light-emitting device 400 with the light-reflective enclosure 440 and a transparent protecting layer 480b, and the light-reflective enclosure 440 and the transparent protecting layer 480b are coplanar to form a sidewall of the light-emitting device 400.

It is noted that the foregoing description has been directed to the specific embodiments of this invention. It will be apparent to those having ordinary skill in the art that other alternatives and modifications can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device, comprising:
a light-emitting stack comprising a top surface, a bottom surface, and a side surface arranged between the top surface and the bottom surface;
a light-reflective enclosure, surrounding the light-emitting stack in a configuration exposing the top surface, and comprising an inner sidewall, a first outer sidewall, and an upper surface between the inner sidewall and the first outer sidewall, wherein the inner sidewall is arranged to face the side surface of the light-emitting stack and the upper surface comprises a first convex area protruded outward from the inner sidewall to the outer sidewall;
a contact electrode formed under the bottom surface of the light-emitting stack; and
a wavelength converting layer covering the top surface and the upper surface, and comprising a second outer sidewall,
wherein the first outer sidewall and the second outer sidewall are coplanar.

2. The light-emitting device of claim 1, wherein the light-reflective enclosure comprises a plurality of corners, the first convex area corresponds to one of the plurality of corners.

3. The light-emitting device of claim 1, wherein the inner sidewall is lower than the outer sidewall.

4. The light-emitting device of claim 1, wherein the upper surface comprises a flat area flush with the top surface and lower than the first convex area.

5. The light-emitting device of claim 4, wherein the upper surface further comprises a second convex area, and the flat area is disposed between the first convex area and the second convex area.

6. The light-emitting device of claim 5, wherein the second convex area corresponds to one of a plurality of corners of the light-reflective enclosure.

* * * * *